(12) United States Patent
Vinson et al.

(10) Patent No.: US 6,982,877 B2
(45) Date of Patent: Jan. 3, 2006

(54) HEAT SINK HAVING COMPLIANT INTERFACE TO SPAN MULTIPLE COMPONENTS

(75) Inventors: Wade D. Vinson, Magnolia, TX (US); John P. Franz, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/783,833

(22) Filed: Feb. 20, 2004

(65) Prior Publication Data

US 2005/0185379 A1 Aug. 25, 2005

(51) Int. Cl.
*H05K 7/20* (2006.01)
(52) U.S. Cl. ............... 361/719; 361/704; 361/717; 165/80.3; 165/185; 257/712; 257/713; 174/16.3
(58) Field of Classification Search ............... 361/703, 361/704, 707, 712–714, 717–721; 257/706, 257/707, 712, 718, 719, 722, 727; 165/80.3, 165/185; 174/16.3
See application file for complete search history.

(56) References Cited

U.S. PATENT DOCUMENTS

| 5,623,394 | A | * | 4/1997 | Sherif et al. ............... 361/705 |
| 5,875,095 | A | * | 2/1999 | Webb ......................... 361/700 |
| 5,966,290 | A | * | 10/1999 | Sammakia et al. .......... 361/705 |
| 6,058,011 | A |  | 5/2000 | Hardt et al. |
| 6,101,459 | A |  | 8/2000 | Tavallaei et al. |
| 6,151,215 | A | * | 11/2000 | Hoffman ...................... 361/704 |
| 6,275,381 | B1 | * | 8/2001 | Edwards et al. ............ 361/717 |
| 6,281,573 | B1 | * | 8/2001 | Atwood et al. .............. 257/706 |
| 6,292,369 | B1 | * | 9/2001 | Daves et al. ................. 361/719 |
| 6,307,747 | B1 | * | 10/2001 | Farnsworth et al. ........ 361/704 |
| 6,519,152 | B1 | * | 2/2003 | Birger .......................... 361/704 |
| 6,656,770 | B2 | * | 12/2003 | Atwood et al. ............. 438/118 |
| 6,667,885 | B2 |  | 12/2003 | Malone et al. |
| 6,730,993 | B1 | * | 5/2004 | Boyer et al. ................. 257/675 |
| 2003/0128518 | A1 | * | 7/2003 | Gaynes et al. .............. 361/704 |

* cited by examiner

*Primary Examiner*—Boris Chervinsky

(57) ABSTRACT

A system, comprising a circuit board having a heat sink spanning multiple components on the circuit board and at least one compliant pad flexibly interfacing the heat sink with the multiple components.

21 Claims, 4 Drawing Sheets

HEAT SINK HAVING COMPLIANT INTERFACE TO SPAN MULTIPLE COMPONENTS

BACKGROUND

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light and not as admissions of prior art.

Electronic devices, such as computer systems, may utilize one or more heat sinks to maintain system components at acceptable operating temperatures. Some heat sinks include a plurality of fins to increase the heat transfer from the components to the environment. In certain applications, fans circulate air in the vicinity of the heat sink to promote a greater rate of heat transfer.

As technology advances, electronic devices contain an increasing number of components that generate heat and, thus, may employ several heat sinks and other complicated cooling configurations. Unfortunately, the use of several heat sinks tends to increase costs and complexity, such as in the manufacturing, assembly, and repair of the electronic devices and associated heat sinks. For example, certain applications may mount the heat sink with glue, solder, thermal grease, and/or multiple screws.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
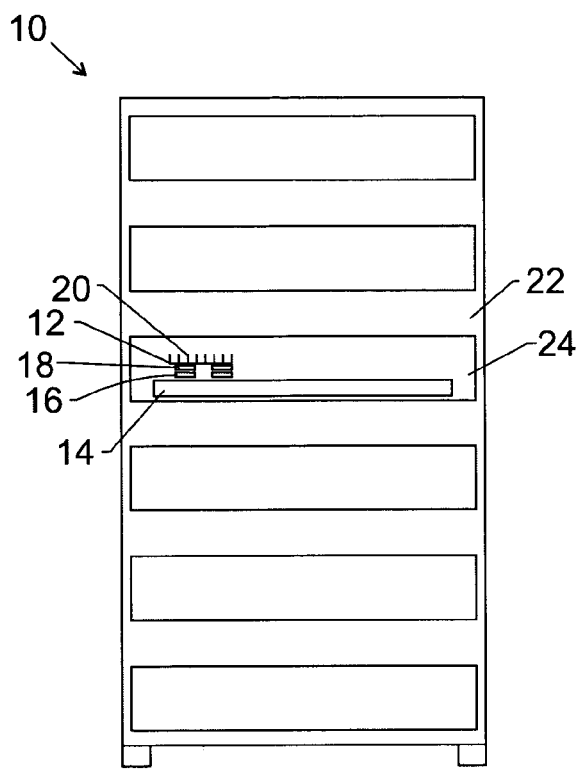
FIG. 1 is a diagrammatical front view of an exemplary rack-mounted computer system having a heat sink mounted on a computer device in accordance with certain embodiments of the present invention.

FIG. 1 illustrates a diagrammatical front view of an exemplary rack-mount computer system 10 in accordance with embodiments of the present invention. Computer servers, for example, may be disposed in rack-mount computer systems 10, as depicted in FIG. 1. It should be noted, however, that the disclosed embodiments apply equally to nonrack-mount systems and to computer systems other than servers, such as desktop computers and portable computers. In general, the disclosed embodiments apply to electronic devices having components that generate heat.

The exemplary rack-mount computer system 10 has a heat sink 12 mounted on a computer device 14, such as a printed circuit board. In the illustrated embodiment, the computer device 14 has a plurality of heat-generating components 16 (e.g., 2–100+ components). The components 16 may sit atop and/or within the computer device 14. A compliant material 18, such as a compressible thermal interface material (TIM), flexibly engages the heat sink 12 to the surface of each of the plurality of heat-generating components 16. Accordingly, the plurality of components 16 each share the full heat-transfer capacity of the heat sink 12, thereby more effectively cooling the components 16 and accommodating heat variation within and among the components 16. The compliant material 18 effectively fills air gaps between the heat sink 12 and multiple components 16 to reduce the thermal resistance across the interface between the heat sink 12 and components 16. Furthermore, protruding members 20, such as fins, prongs, or pins, provide additional surface area on the heat sink 12 to promote heat transfer from the components 16 to the environment. As previously discussed, fans (not shown) also may circulate air over protruding members 20 to enhance the heat transfer away from the components 16. As for the overall structure of system 10, a protective rack 22 has a plurality of bays to support various rack-mountable components, such as servers. In the illustrated embodiment, the computer device 14 is disposed within a bay 24 of the rack 22.

In certain embodiments, the compliant material 18 may comprise a Polarchip CP7003 thermal interface by Gore Electronic Products, of Elkton, Md. The compliant material 18 also may have a pressure-sensitive adhesive applied to one or both sides. In the form of component pads, for example, this compliant material 18 may cushion and conform to the interface between the heat sink 12 and the components 16. For example, strips or pads of the exemplary compliant material 18 may be cut or formed to widths and lengths that substantially cover the desired surfaces (see FIG. 4) on the bottom of the heat sink 12 or on the components 16. By further example, an adhesive side of strips or pads of the compliant material 18 may be affixed to the bottom of heat sink 12. Exemplary thicknesses of the Gore Polarchip CP7003 thermal interface are in the range of 0.25 to 3.00 millimeters (mm). For example, a 0.50 mm thick pad of the Polarchip CP7003 compliant material 18 has a 1.1 Watts per meter-Kelvin (W/mK) thermal conductivity and a 5.4 degrees Celsius-square centimeter per Watt (°C.-$cm^2$/W) thermal resistance at 50 pounds per square inch (psi) (38% compression). Therefore, the compliant material 18 is particularly well-suited for low-power components 16, such power Application Specific Integrated Circuits (ASICs), and other components. In one application, the components 16 generate low power in the range of 0.5–15.0 Watts each.

It should be emphasized that certain embodiments may utilize a variety of compliant materials 18 other than that described in the above example. Heat transfer and mechanical calculations may specify the complaint material 18 by determining, for example, the required conductivity or thermal resistance of material 18, and yield or compressive strength of the material 12. Such calculations may involve the wattage and desired operating temperatures of the components. Other factors may include the materials of construction of the heat sink 12 and components 16 (and the related conductivity, strength, roughness, and the like), the topography of the components 16 and computer device 14, the interface contact pressure between the heat sink 12 and components 16, and so forth.

Figure 2:
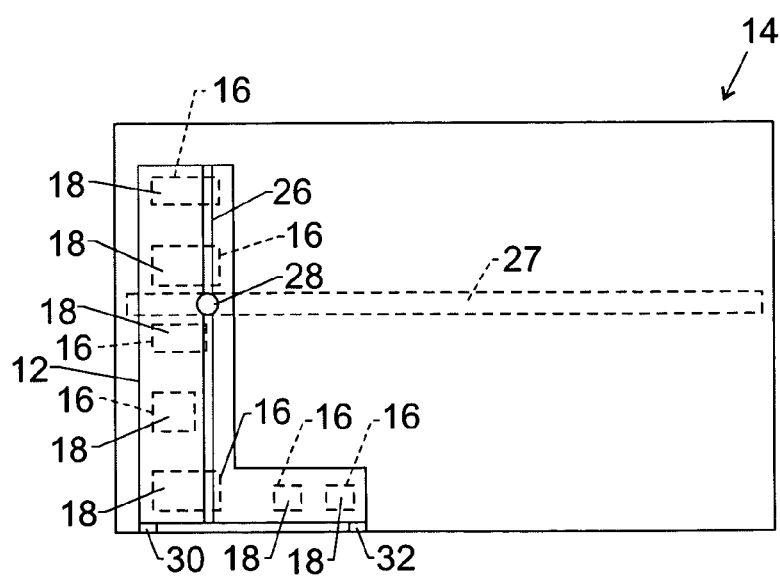
FIG. 2 is a diagrammatical top view of the computer device and heat sink of FIG. 1 in accordance with certain embodiments of the present invention.

FIG. 2 illustrates a diagrammatical top view of the heat sink 12 and the computer device 14 (e.g., circuit board) of FIG. 1 in accordance with embodiments of the present invention. In the illustrated embodiment, the heat sink 12 spans and conforms to a plurality of components 16 of different shapes and sizes in all three dimensions. For example, certain components 16 may be thicker than others, thereby creating different heights of the components 16 across the computer device 14. Accordingly, the heat sink 12 may have peaks and crevices to accommodate uneven component heights and other variations. The flexible (e.g., compressible and conformable) nature of the compliant material 18 further accommodates these dimensional variations between the heat sink 12 and components 16.

In this example, the heat sink 12 has a lengthwise stiffener 26 (or stiffening rib), which facilitates a uniform interface of the heat sink 12 onto the plurality of components 16 via the compliant material 18. For example, the stiffening rib 26 may substantially reduce bending of the heat sink 12 to ensure that the heat sink 12 interfaces each component 16 and compliant material 18 with a substantially planar surface and uniform pressure. Also, the illustrated embodiment has a backside stiffener 27 disposed on a backside of the device 14 opposite the heat sink 12. In certain embodiments, the heat sink 12 may be affixed to the backside stiffener 27 via the mounting mechanism 28, thereby linking the stiffening rib 26 and backside stiffener 27 in a T-shaped configuration. In other embodiments, an additional heat sink 12 may be affixed to the backside stiffener 27 at an opposite end, such that the stiffening rib 26 and backside stiffeners 27 are coupled in an I-shaped configuration. Yet other embodiments may employ a variety of stiffening rib and stiffener rib configurations, or apply no stiffening configuration.

As discussed below, the heat sink 12 may comprise a variety of mounting mechanisms, such as tool-type and tool-free mounts. Certain embodiments have tool-free coupling mechanisms, such as latches, hooks, snap-fit mechanisms, hand-actuated screws, spring-loaded fasteners, and so forth. Moreover, these coupling mechanisms may be disposed at multiple points (e.g., three points—triangular pattern) to facilitate better load distribution between the heat sink 12, the plurality of components 16, and the intermediate compliant material 18. In the illustrated embodiment, the heat sink 12 has mounting mechanisms 28, 30, and 32 disposed in a triangular three-point configuration.

In sum, with a single heat sink 12 spanning multiple components 16, certain embodiments realize cost savings and benefit from easier assembly (even more so with the tool-free installation). Moreover, the use of a single heat sink 12 for multiple components 16 improves the thermal performance through efficient distribution of the component 16 heat loads, as discussed above.

Figure 3:
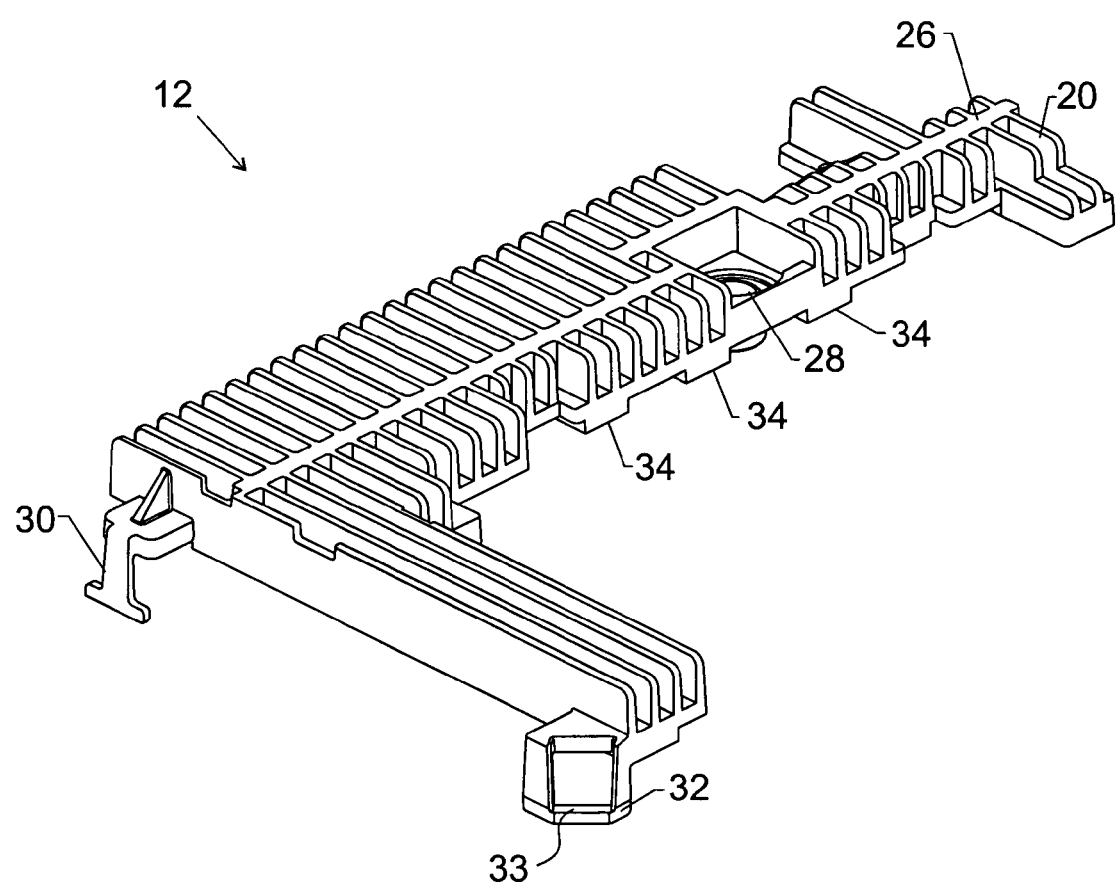
FIG. 3 is a perspective view of the heat sink of FIGS. 1 and 2 in accordance with certain embodiments of the present invention.

FIG. 3 illustrates a detailed perspective view of the heat sink 12 in accordance with embodiments of the present invention. Again, the heat sink 12 has the lengthwise stiffener 26 to reduce bending of the heat sink 12 and the device 14, thereby improving the thermal interface between the heat sink 12 and the multiple components 16. One embodiment of the heat sink 12 comprises a cast aluminum structure having a clear chromate coating. The illustrated heat sink 12 also has the protruding members 20 to increase the surface area for increased heat transfer. Moreover, the illustrated embodiment of the heat sink 12 has a plurality of different component interface structures 34, which are adapted to conform to the dimensions, shapes, and positions of components 16 mounted on the device 14.

In the illustrated embodiment, the heat sink 12 also has the mounting mechanism 28, 30 and 32 disposed in a three-point (i.e., triangular) configuration, which facilitates a balanced engagement between the different component interface structures 34 and the components 16. In certain embodiments, the mounting mechanism 28 may comprise a spring-loaded snap-fit fastener or a threaded fastener (e.g., tool-free or hand-actuated) to compress the heat sink 12 onto the device 14. Furthermore, some embodiments of the mounting mechanisms 30 and 32 comprise tool-free couplings, e.g., latches or snaps. However, a variety of other tool-type and/or tool-free coupling mechanisms 28, 30, and 32 may be used to affix the heat sink 12 to the computer device 14.

The illustrated mounting mechanisms 30 and 32 comprise edge-mounting hooks or tabs, which engage edge portions (e.g., slot or corner) of the device 14 (e.g., circuit board). For example, the mounting mechanism 30 comprises a T-shaped structure or toe-in tab, which is mountable into an edge slot (not shown) of the device 14. The illustrated mounting mechanism 32 comprises an angled slot or corner hook 33, which is mountable with a corner portion (not shown) of the device 14. For mounting of the heat sink 12, the mounting mechanisms 30 and 32 are first hooked or latched with edge and corner portions of the device 14, and then the mounting mechanisms 28 compressively couples the heat sink 12 onto the device 14 over the components 16 and the compliant material 18. Again, the mounting mechanism 28 may comprise a threaded fastener (e.g., thumb screw), a spring-loaded snap-fit fastener, or another suitable fastener. Alternative embodiments may have other fastening mechanisms, which compress the heat sink 12 onto the components 16 to a desired pressure, e.g., 10, 20, 30, 40, 50, or higher psi.

Figure 4:
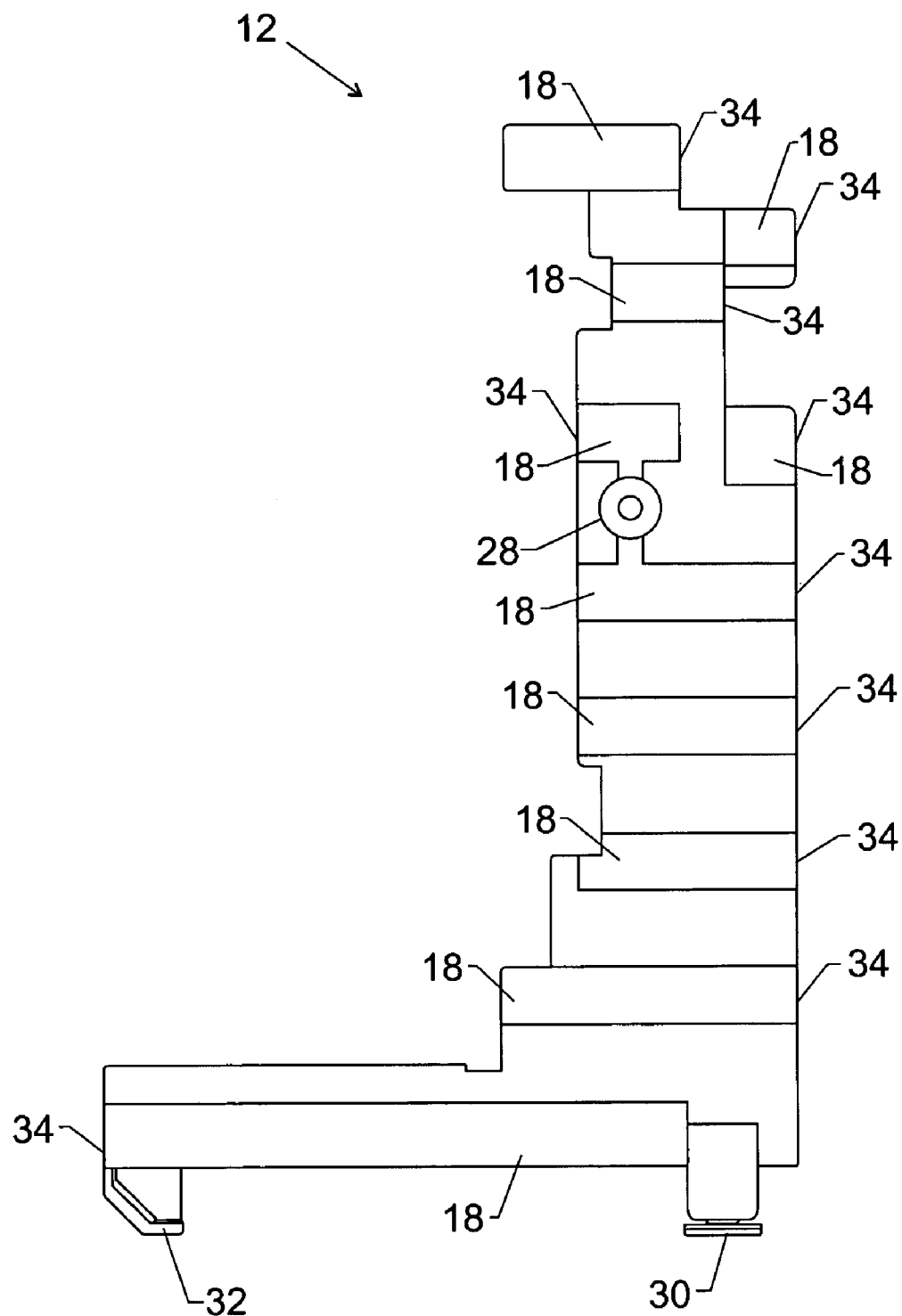
FIG. 4 is a diagrammatical bottom view of the heat sink of FIGS. 1–3 in accordance with certain embodiments of the present invention.

FIG. 4 illustrates a diagrammatical bottom view of the heat sink 12 illustrating the different component interface structures 34 in accordance with embodiments of the present invention. As discussed above, the components 16 disposed on the device 14 may have varying geometries, heights, voids, and the like. In the illustrated embodiment, the heat sink 12 includes the different interface structures 34 to accommodate these different shapes and sizes in all three dimensions (e.g., length, width, and height). As illustrated, the different interface structures 34 each have cross-sectional surface areas adapted to fit the mating cross-sectional surface areas of the plurality of components 16. In addition, the different interface structures 34 each project or recess to a distance adapted to fit the thickness or height of the mating components 16.

Figure 5:
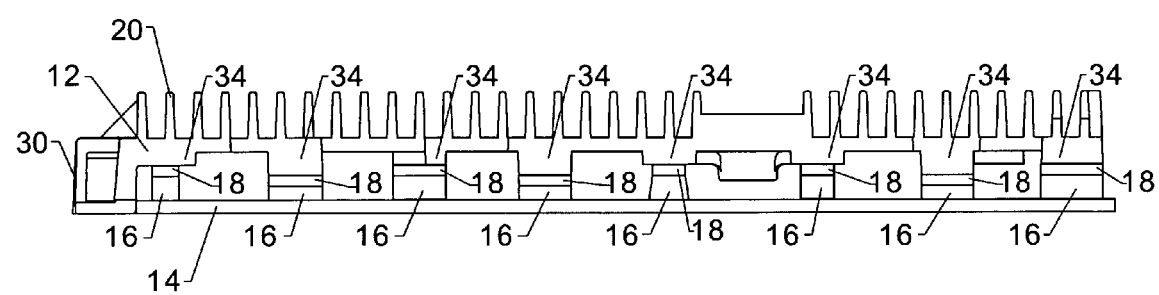
FIG. 5 is a diagrammatical side view of an assembled configuration of a heat sink and computer device in accordance with certain embodiments of the present invention.

FIG. 5 illustrates a diagrammatical side view of an assembled configuration 36 of the heat sink 12 and computer device 14 in accordance with embodiments of the present invention. The plurality of components 16 are illustrated having different heights and shapes. The compliant material 18 is compressed and flexibly engages the raised surfaces 34 of the heat sink 12 to the plurality of components 16.

Additionally or alternatively, the compliant material 18 accommodates the different shapes and dimensions of the components 16. In this exemplary embodiment, the compliant material 18 comprises pads of compressible thermal interface material, which have dimensions cut or formed to fit each surface of the different interface structures 34. Also, the initial thickness of each pad of compliant material 18 may vary depending on the particular component 16 and dimensional variations or gaps between the heat sink 12 and the component 16. In operation, the compliant material 18 may compress from an initial pad thickness to a compressed thickness (e.g., 10, 20, 30, 40, 50 or 60% compression) to fill any residual dimensional variations or gaps between the heat sink 12 and the component 16. Thus, the compliant material 18 with or without the custom-fit geometries of the interface structures 34 facilitates a continuous and uniform thermal interface between the heat sink 12 and the multiple components 16. The illustrated compliant material 18 also has an adhesive side, which mates to the bottom of the heat sink 12.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A system, comprising:
   a computer device;
   a heat sink coupled to the computer device over a plurality of components disposed on the computer device, wherein the heat sink comprises a component interface having varying heights at least substantially corresponding to heights of the plurality of components;
   a compliant non-paste material flexibly engaging the component interface of the heat sink against the plurality of components;
   a fastener configured to compress the compliant non-paste material between the heat sink and the plurality of components.

2. The system of claim 1, wherein the computer device comprises a circuit board and each of the plurality of components extends to a different height on the circuit board.

3. The system of claim 1, wherein the heat sink comprises a stiffening rib.

4. The system of claim 1, wherein the compliant non-paste material has a thermal resistance of less than 10 degrees Celsius-square centimeter per Watt.

5. The system of claim 1, wherein the fastener comprises first, second, and third mounting fasteners in a triangular configuration.

6. A system, comprising:
   a rack; and
   a device mounted in the rack, the device comprising:
      a plurality of components;
      a heat sink having an interface spanning the plurality of components, wherein the heat sink comprises surfaces that at least substantially match with heights of contact surfaces of the plurality of components; and
      a flexible thermal interface material disposed between the heat sink and the plurality of components, wherein the flexible thermal interface material comprises a thermally conductive pad having a surface with an adhesive disposed thereon.

7. The system of claim 6, comprising at least one tool-free mount mechanism mounting the heat sink to the device.

8. The system of claim 7, wherein the device comprises a computer server.

9. The system of claim 7, wherein the flexible thermal interface material has a thermal resistance of less than 10 degrees Celsius-square centimeter per Watt.

10. The system of claim 7, wherein the plurality of components comprise an electronic component having a power rating of less than 15 Watts.

11. A heat sink, comprising:
    a base comprising a plurality of protruding members and a mounting surface adapted to span a plurality of electronic components having differing contact-surface heights, wherein the mounting surface comprises a plurality of surfaces disposed at different elevations that substantially conform to the differing contact-surface heights of the plurality of components;
    a flexible thermal interface material disposed on the mounting surface, wherein the flexible thermal interface material is adapted to interface the heat sink flexibly with the plurality of electronic components; and
    first, second, and third mounting fasteners disposed in a triangular configuration and configured to compress the thermal interface material between the base and the plurality of components.

12. The heat sink of claim 11, wherein the heat sink comprises a stiffening member extending lengthwise along the base.

13. The heat sink of claim 11, wherein the heat sink comprises at least one tool-free mounting mechanism.

14. The heat sink of claim 11, wherein the flexible thermal interface material has a thickness of less than 2 millimeters.

15. The system of claim 11, wherein the plurality of protruding members comprise a plurality of fins configured to provide additional heat-transfer surface area to advance convective heat-transfer.

16. A system, comprising:
    a removable heat sink comprising at least one tool-free mounting mechanism;
    a circuit board having the removable heat sink spanning multiple components on the circuit board, the multiple components having differing contact-surface heights relative to the circuit board, wherein the heat sink comprises an interface structure having surfaces disposed at different heights that at least substantially correspond with the differing contact-surface heights of the multiple components; and
    at least one compliant pad flexibly interfacing the heat sink with the multiple components.

17. A method, comprising:
    providing a heat sink having a mounting interface adapted to span at least two components of an electronic device, wherein the mounting interface comprises multi-elevational surfaces that at least substantially elevationally correspond with contact surfaces of the at least two components; and
    providing a compliant material adapted to interface the heat sink flexibly with the at least two components, wherein the compliant material comprises a thermally conducting pad having at least one surface with an adhesive disposed thereon.

18. The method of claim 17, comprising providing a tool-free mounting mechanism for mounting the heat sink to the electronic device.

19. The method of claim 17, wherein the thermally conductive pad has a thermal resistance of less than 10 degrees Celsius-square centimeter per Watt.

20. A system, comprising:
   means for spanning and at least substantially elevationally matching surfaces of a heat sink over a plurality of electronic components having contact surfaces of different elevations;
   means for flexibly and thermally interfacing the heat sink with the plurality of components; and
   means for compressing the means for flexibly and thermally interfacing between the heat sink and the plurality of components.

21. The system of claim 20, wherein the means for compressing comprises means for adjusting compression of the means for flexibly and thermally interfacing.

* * * * *